United States Patent [19]
Blitz

[11] Patent Number: 6,047,293
[45] Date of Patent: Apr. 4, 2000

[54] SYSTEM FOR STORING AND SEARCHING NAMED DEVICE PARAMETER DATA IN A TEST SYSTEM FOR TESTING AN INTEGRATED CIRCUIT

[75] Inventor: Alan L. Blitz, Newton, Mass.

[73] Assignee: Teradyne, Inc., Boston, Mass.

[21] Appl. No.: 08/931,784

[22] Filed: Sep. 16, 1997

[51] Int. Cl.[7] ..................................................... G06F 17/30
[52] U.S. Cl. ......................... 707/104; 707/103; 714/724; 345/352
[58] Field of Search ................................ 395/704, 183.08, 395/200.47; 73/587; 364/578; 371/221, 27.1, 22.1; 702/117, 118

[56] References Cited

U.S. PATENT DOCUMENTS

| | | | |
|---|---|---|---|
| 5,418,947 | 5/1995 | Hsu et al. | 707/1 |
| 5,467,291 | 11/1995 | Fan et al. | 364/578 |
| 5,473,942 | 12/1995 | Vick et al. | 73/587 |
| 5,606,568 | 2/1997 | Sudweeks | 371/27.1 |
| 5,630,126 | 5/1997 | Redpath | 707/103 |
| 5,633,879 | 5/1997 | Potts et al. | 371/27.1 |
| 5,673,272 | 9/1997 | Proskauer et al. | 371/22.1 |
| 5,712,995 | 1/1998 | Cohn | 345/342 |
| 5,737,512 | 4/1998 | Proudfoot et al. | 395/183.08 |
| 5,745,767 | 4/1998 | Rosen et al. | 395/704 |
| 5,764,908 | 6/1998 | Shoji et al. | 395/200.47 |
| 5,777,841 | 7/1998 | Stone et al. | 702/118 |
| 5,801,701 | 9/1998 | Koppolu et al. | 345/352 |
| 5,828,674 | 10/1998 | Proskauer | 714/724 |
| 5,828,675 | 10/1998 | Proskauer | 371/22.1 |
| 5,835,891 | 11/1998 | Stoneking | 702/117 |
| 5,893,123 | 4/1999 | Tuinenga | 707/504 |
| 5,910,895 | 6/1999 | Proskauer et al. | 364/468.28 |
| 5,938,781 | 8/1999 | Proskauer | 714/724 |

FOREIGN PATENT DOCUMENTS 0 397 937 A2  11/1990  European Pat. Off. .

OTHER PUBLICATIONS

Shidlovsky, Boris; Bertino, Elisa, *A Graph–Theoretic Approach to Indexing in Object–Oriented Databases*, Feb. 26, 1996, pp. 230–237; see figure 1.

J971 Series IG900+ Tools manual, V2.5, May 1993, pp. 1.1–1.27.

J971 Series ADR Reference, May 1993, pp. 25–38.

*Primary Examiner*—Thomas G. Black
*Assistant Examiner*—Charles L. Rones

[57] ABSTRACT

This invention relates to automatic test equipment used in the manufacture of semiconductors and to the storage and searching of the named device parameter data used in the testing. A spreadsheet workbook has one or more spreadsheets containing nested levels of named device parameter data. A data manager stores the named data in a memory and searches for the stored named data when appropriate. The data manager has one or more containers each having a mode for storing nested levels of the named data in the form of a binary tree, and also in an ordered sequence vector. The data in the tree is mapped into the ordered sequence vector with numerical indicia defining the position of the named data in the ordered sequence vector. The containers are nested the same as the nested levels of the named data. Each container has a search mode which searches the tree for the named data and uses the mapping indicia associated with the named data to find the named data in the ordered sequence vector. The container then stores the numerical indicia. This search finds the named data and its order in the nested levels.

22 Claims, 11 Drawing Sheets

Microfiche Appendix Included
(6 Microfiche, 156 Pages)

| PINGROUP | PIN OR PINGROUP | TYPE |
|---|---|---|
| | P1 | |
| | P2 | |
| | P3 | |
| | P4 | |
| | P5 | |
| | P6 | |
| | P9 | |
| | P10 | |
| | P11 | |
| | P12 | |
| | P13 | |
| | P14 | |
| PG11 | P1 | |
| PG11 | P5 | |
| PG11 | P10 | |
| PG11 | P12 | |
| PG11 | P13 | |
| PG11 | P14 | |
| PG1 | P1 | |
| PG1 | P4 | |
| PG1 | P5 | |
| PG1 | PG11 | |
| PG2 | P1 | |
| PG2 | P5 | |
| PG2 | P6 | |
| PG2 | P9 | |

FIG. 3

TIME SET SPREAD SHEET

| TIME SET | PIN | EDGE SET |
|---|---|---|
| T1 | P1 | E2 |
| T1 | P2 | E2 |
| T1 | P3 | E1 |
| T2 | P1 | E2 |
| T2 | P2 | E9 |
| T2 | P3 | E4 |
| T3 | P1 | E1 |
| T3 | P2 | E6 |
| T3 | P3 | E4 |

FIG. 10

SYSTEM FOR STORING AND SEARCHING NAMED DEVICE PARAMETER DATA IN A TEST SYSTEM FOR TESTING AN INTEGRATED CIRCUIT

BACKGROUND OF THE INVENTION

A microfiche appendix containing computer program information on two sheets of microfiche a total 156 frames in included as part of the specification.

BACKGROUND OF THE INVENTION

1. Field of the Invention

This invention relates generally to automatic test equipment used in the manufacture of semiconductors and more specifically to the storage and searching of the named device parameter data used in the testing.

2. Description of the Related Art

Automatic test equipment is widely used in the manufacture of semiconductors. Semiconductors are generally tested at least once during their manufacture and are sometimes tested at more than one step in the manufacturing process. Because every component is tested, speed of testing is critical to the economic manufacture of semiconductors. Slow testing prevents full utilization of the expensive capital equipment needed to produce semiconductor components. Modern semiconductor components are very complicated and have many operating states. Each of these operating states must be exercised to perform a complete test. Automatic test equipment is therefore designed to apply test data to a semiconductor device and make numerous measurements very quickly in a production setting.

FIG. 1 shows a generalized automatic test system of the prior art. To provide thorough and fast testing, the automatic test system generally includes a tester body 112, a computerized work station 110 and a handling device 114. The computer work station 110 controls both the handling device 114 and the tester body 112. It controls the handling device 114 to position the semiconductor device (not shown) where it makes contacts with numerous test probes 118 on the tester body 112. Often, a tester will include a separate test head containing test probes 118. However, such a distinction is not important for the invention.

Work station 110 then controls tester body 112 to run a series of tests on the device under test. Each test generally includes a setup portion in which control signals are sent from the work station 110 to the tester body 112. The control signals are usually digital values sent over bus 116. These control signals configure the hardware within tester body 112 to make the measurements required for the test. The hardware within the tester body provides stimulus and measures responses from the device under test in accordance with the control signals.

FIG. 1 shows that the hardware within tester body 112 includes numerous circuits identified as pins 124. Each pin 124 generates signals or makes measurements for one of the test probes 118. Each pin might provide or measure a static, or DC, signal. Alternatively, each pin 124 might provide or measure changing data in what is sometimes called a "burst".

During a burst, tester body 112 is controlled by timing and sequencing circuit 120. Timing and sequencing circuit 120 causes each of the pins 124 to read a sequence of data values from an associated memory 128. Each data value indicates the type of signal the pin should apply or expect to measure at its associated test probe 118 at a specific point in time. If the pin compares a measurement to an expected value, the results might also be stored in memory 128.

The set of data values that define the values all the pins 124 should provide or expect to measure at one time is called a "vector." During a burst, many vectors are executed. The vectors must be executed at a very high rate to simulate actual operating conditions of the device under test. There are usually millions of vectors to define the bursts needed to test a semiconductor device. The vectors are typically loaded into memories 128 at the time test system is programmed to test a particular type of part. This loading process might take several minutes and is not repeated for each burst. Rather, for each burst, work station 110 sends commands indicating which vectors are to be executed as part of the burst. Once the burst is completed, work station 110 reads the results of the burst from memory 128 or timing and sequencing circuit 120.

In addition, tester body 112 includes one or more instruments 126. An instrument performs a specific test function. It might for example generate a specific test signal such as a sine wave. Alternatively, an instrument might sample a signal at a high rate so that it can later be analyzed by a digital signal processor. These functions might be performed as part of a burst or might be performed separate from a burst.

A full test of a part, sometimes called a "job", will consist of a series of bursts interspersed with DC measurements or measurements by instruments 126. The bursts might be used to measure specific functional attributes of the device under test. Alternatively, each burst might be used only to place the device under test into a state in which a DC measurement can be taken. The order in which these elements of a test are performed, sometimes called the "flow," is dictated by software in work station 110.

Once a device has been fully tested, or tested to the point where it is determined to be defective, work station 110 generates control signals to the handling device 114. Handling device 114 then presents the next device to be tested to tester body 112 and the process is repeated. Work station 110 also gathers data about whether particular devices passed or failed. It can process this data so that defective devices are discarded or it can perform other functions, such as analyzing the data for failure trends.

Because large amounts of data are used in testing, the speed of retrieval of stored named device parameter data is very important for efficient testing. What is desired is a method for storage of the data in memory so that rapid searching to retrieve the data is possible.

SUMMARY OF THE INVENTION

The present invention is a semiconductor test system in which a spreadsheet workbook has one or more spreadsheets containing nested levels of named device parameter data. A data manager stores the named data in a memory and searches for the stored named data when appropriate. The data manager has one or more containers each having a mode for storing nested levels of the named data in the form of a binary tree, and also in an ordered sequence vector. The data in the tree is mapped into the ordered sequence vector with numerical indicia defining the position of the named data in the ordered sequence vector. The containers are nested the same as the nested levels of the named data.

Each container has a search mode which searches the tree for the named data and uses the mapping indicia associated with the named data to find the named data in the ordered sequence vector. The container then stores the numerical indicia. This search finds the named data and its order in the nested levels.

DESCRIPTION OF THE DRAWINGS

FIG. 3 is an example of a spreadsheet for a pinmap.

FIG. 10 shows a spreadsheet illustrating that a pin name may be used several times in one nested level of data.

DETAILED DESCRIPTION OF THE INVENTION

Figure 1:
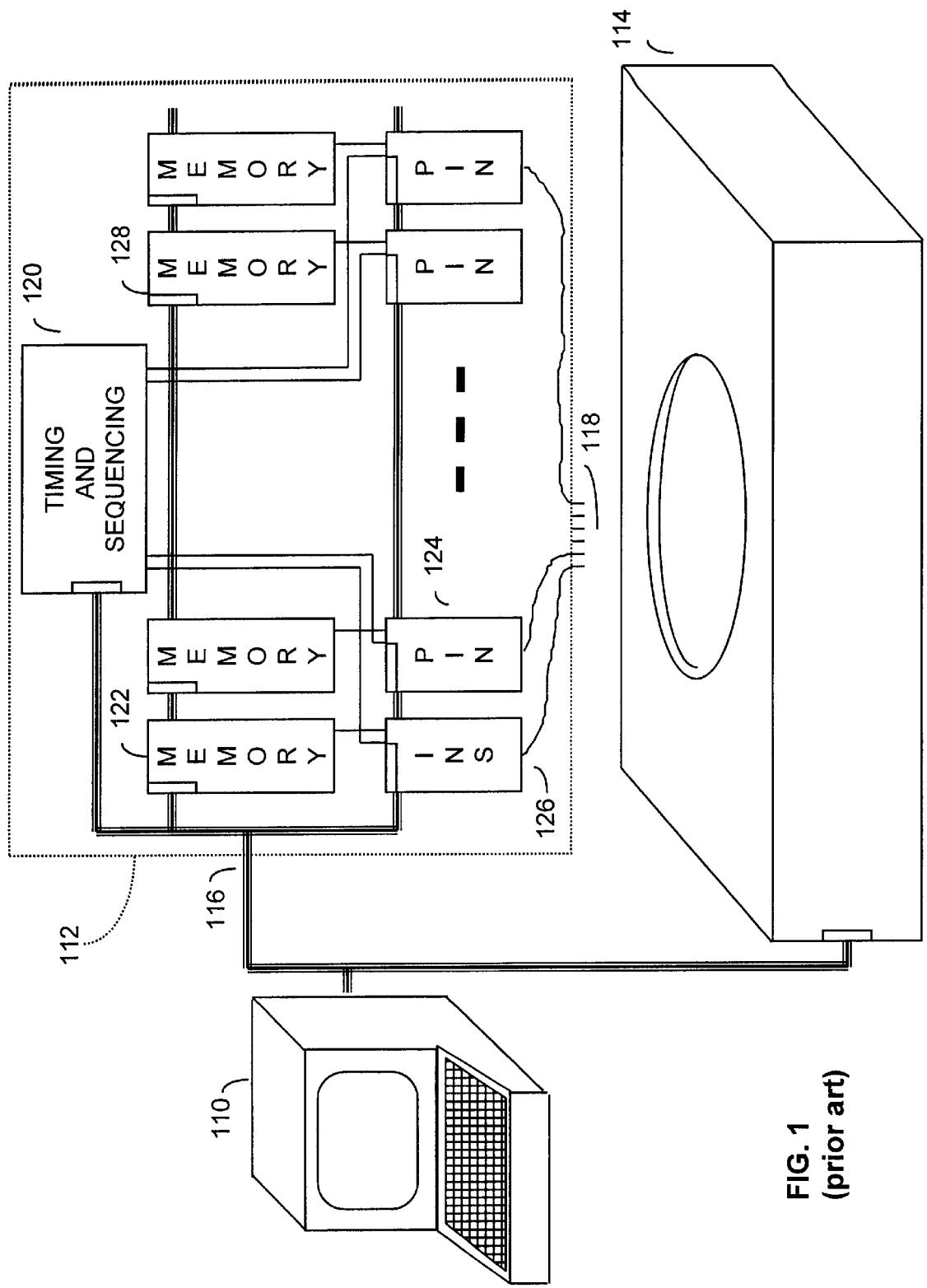
FIG. 1 is a hardware block diagram of a prior art tester.
Figure 2:
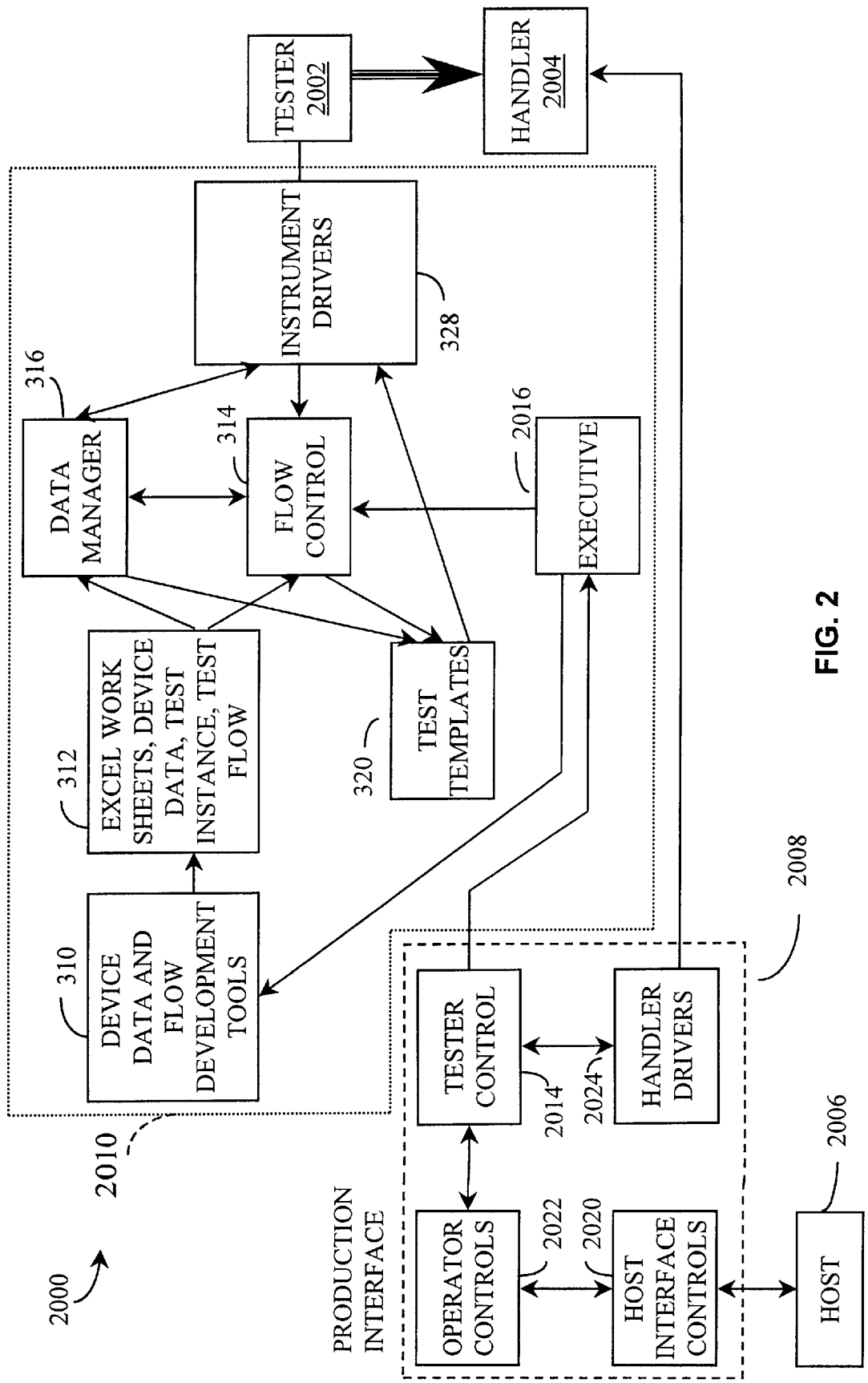
FIG. 2 is a functional block diagram of the tester of the present invention.

FIG. 2 is a detailed functional block diagram of the complete test system of the present invention. The system includes a PC work station 2000, test hardware 2002, a handler 2004, and a host 2006. The software of work station 2000 is made up of a production interface 2008 and test development and execution program module 2010.

Looking first at production interface 2008, it serves as the interface between the operator and test development and execution program 2010, host 2006 and handler/prober 2004. In the preferred embodiment, the production interface 2008 is made up of controls called "ActiveX" controls written in Visual Basic™ from Microsoft Corporation™ of Redmond, Wash. These controls can be combined quickly and easily into a graphical user interface (GUI) using Visual Basic or can be used as a programmatic interface without a GUI. The Active X controls allow the operator to initiate an action in test development and execution program 2010, host 2000, or handler 2004. The operator during production testing uses an active X control to communicate with executive 2016 in test development and execution program 2010 to initiate execution of a production test.

In addition, the operator may initiate accompanying actions by the handler 2004 and the host 2006. The operator controls 2022 have an ActiveX handler control that lets an operator select a handler from a menu of available handler drivers 2024, connect it to handler 2004, and enable it. Handler 2004 presents the device to be tested to tester 2004. Production interface 2008 also has an ActiveX host interface control 2020 which allows the operator to connect the host 2006 to the tester 2002. On the production floor, a tester 2002 is typically connected to a host 2006 which monitors tester status, collects test results, and can control the testing process directly. The Host interface control 2020 translates the Tester Control 2014 API into standard messages sent to or received from host 2006. Production interface 2008 is used only at test execution time during production testing. The Production Interface, Handler Drivers and Host are disclosed in a co-pending patent application, assigned to the same assignee Teradyne, entitled "PRODUCTION INTERFACE FOR AN INTEGRATED CIRCUIT TEST SYSTEM", to Daniel C. Proskauer, filed Sep. 16, 1997 now issued as U.S. Pat. No. 5,828,674.

Test development and execution program 2010 operates within the Windows NT (Trademark of Microsoft Corporation of Redmond Wash.)™ operating system and is made up of software divided into elements that are used 1) at test development and analysis time and 2) at test execution time.

Excel workbook 312 is the portion of the program used to develop tests during test development and analysis time. Excel is a spreadsheet program that allows an application to be developed. Visual Basic is a programming language built into Excel.

In the preferred embodiment, the device development and flow development tools 310 are implemented by customized spreadsheets within the Excel workbook 312. Three types of data need to be specified by the spreadsheets for a test: device data, test flow data, and test instance data. For device data there may be spreadsheets for time sets, channel maps, edge sets or pinmaps or a variety of other types of data. Each of these spreadsheets is a dataset. Test instance data spreadsheets specify a test template from test template library 320 and its associated device data set. A test template and its associated data set is called an "instance". Test flow data may be spread sheets specifying a series of test steps that are to be executed. The series of test steps may be the execution of a series of test instances.

Summarizing, the Excel spreadsheet information 312 includes the device data sets, the test instance information which defines which templates are to be used with the associated data set, and the test flow information defining the sequence of test instances to be executed.

Test Templates 320 are written in Visual Basic and are normally provided by the manufacturer. The data device and flow development tools 310, Excel worksheets 312 and manufacturer provided test templates 320 are used during test development and analysis time prior to the time of test execution.

Test templates 320 and Excel worksheets 312 are used also during production testing. The additional software of test development and execution program 2010 that is used at test execution time during production testing is the executive 2016, flow control software 314, data manager 316, and instrument drivers 328. All of this software works in the Windows NT™ operating system environment.

Executive 2016 is written in Visual Basic. It controls the initiation and execution of the production testing in response to an ActiveX control from Production Interface 2008. Executive 2016 initiates action by flow control 314. In response to executive 2016, flow control software 314 builds a job control data structure that lists each template that is to be executed and the data that is to be used for execution of that template. The job control data structure could be an indexed list, but other implementations are possible.

In building the job control data structure, the first template is determined from the first instance in the flow data sheet from Excel worksheets 312. The template associated with this instance is determined from the instance data sheet. A notation for the template is entered into the job control data structure. In addition the device data to be used with the first template is determined from the instance data sheet.

An identification of the device data to be used for the specified test template is added to the job control data structure. At this point, data manager 316 passes data from the Excel workbook 312 to the instrument drivers for application to the tester 2002. Data manager 316 assembles parameter data structures that hold the specific data passed to tester 2002 during a test job.

Once information to identify the templates and the data values are added to the job control data structure, the conditions for executing the next template specified in the flow sheet are determined. After all templates are determined the flow control software 314 enters an idle state.

When flow control software 314 is in its idle state, it might receive a command from a user through tester control 2014 and executive 2016 to run a test job or it might receive a start signal from handling device 2004, indicating that a device under test has been loaded and is ready for testing. When the command to run a test job is received the first template from the job control data structure is read. The template is called as a subprogram from test templates 320 with the specified arguments from the job control data structure. The template subprogram then executes and returns to flow control software 314.

Each template subprogram that represents a test indicates whether the test passes or fails. The state of the test job is updated based on the value returned by the test template that was just called. For example, the test will indicate whether a test template executed without detecting an error (i.e. the test passed) or whether an error was detected.

The new state of the test is used to evaluate a logical expression stored in the job flow data structure. Based on that evaluation, the next template is selected. If there are no additional templates, flow control software 314 returns to its idle state.

In the preferred embodiment, the results of a test job are not presented to a user or to the handling device 114 as the test is completed. Presenting data slows execution of the test job. Therefore, the results of the execution of each test job are stored in computer memory until a request is made. The request for results causes flow control software 314 to pass from idle state and display the results for a human user or pass them a handling device 114. Flow control 314, data manager 316, and instrument driver 328 are all written in C++.

The Test Development and Execution Module 2010 is more fully disclosed in a co-pending patent application, assigned to the same assignee Teradyne, entitled "LOW COST, EASY TO USE AUTOMATIC TEST SYSTEM SOFTWARE" to Daniel C. Proskauer and Predeep B. Deshpande, , filed on Jun. 13, 1997 and assigned U.S. Pat. No. 5,910,895, which is hereby incorporated by reference.

The speed with which datamanager 316 can retrieve device data is critical for several reasons. This determines how fast a test on a device (i.e. job) is performed. In addition fast retrieval is important for the validation procedures for the data on the Excel spreadsheets. The data on one spreadsheet must be consistent with the data on all other spreadsheets. The speed of searching is one of the features of the present invention.

Figure 4:
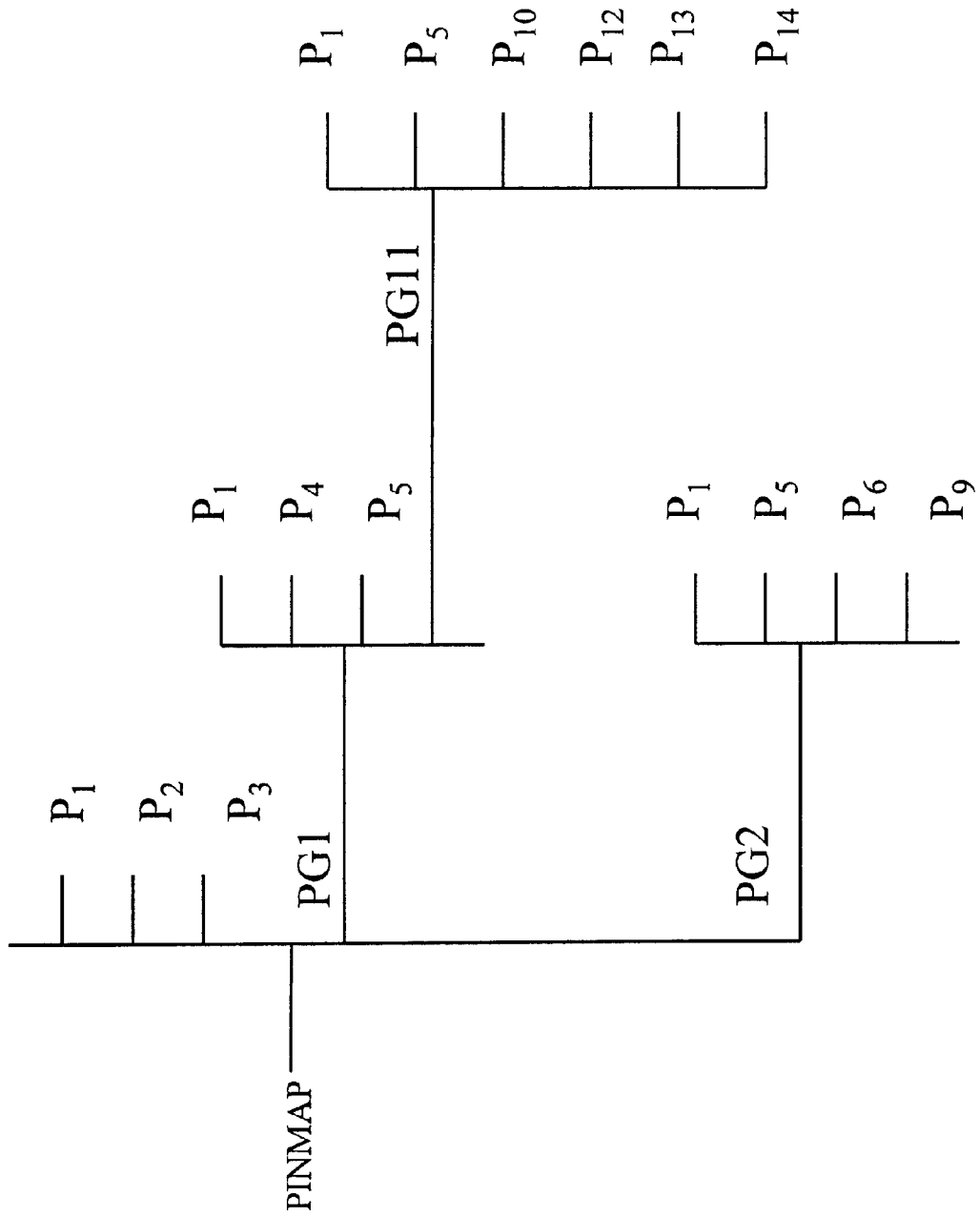
FIG. 4 shows a graphical representation of the pinmap data of FIG. 3.

The Excel spreadsheets contain all the data required for a test. The Excel data needs to be stored in the datamanager in such a way that it may be retrieved quickly and accurately. FIG. 3 shows an example of a pinmap spreadsheet. Other Excel datasheets have similar data related to channels, timesets, edgesets and other device data parameters. In the Excel spreadsheet the pins are P1 through P14 and pingroup PG11 shown in column 2. Pingroups PG1,PG2,PG11, are shown in column 1. Other information is given in column 3(not shown). FIG. 4 shows a graphical representation of the pinmap data of FIG. 3 with some pins and pingroups being nested. Pins P1,P2,P3, and Pingroups PG1,PG2 make up the first layer of data. Pin group PG1 including pins P1,P4,P5, and pingroup PG11 makes up part of the second layer of data that is nested within the first layer of data. The rest of the second layer of data is made up pingroup PG2 which is nested in the first layer of data also. A third layer of data is pingroup PG11 which is nested within pingroup PG1. The nesting may continue through as many layers of data as necessary.

The datamanager needs to store the data for each of the spreadsheets and be able to support efficient search through the nested data of any of the spreadsheets at any time during the loading or execution of a job.

Figure 5:
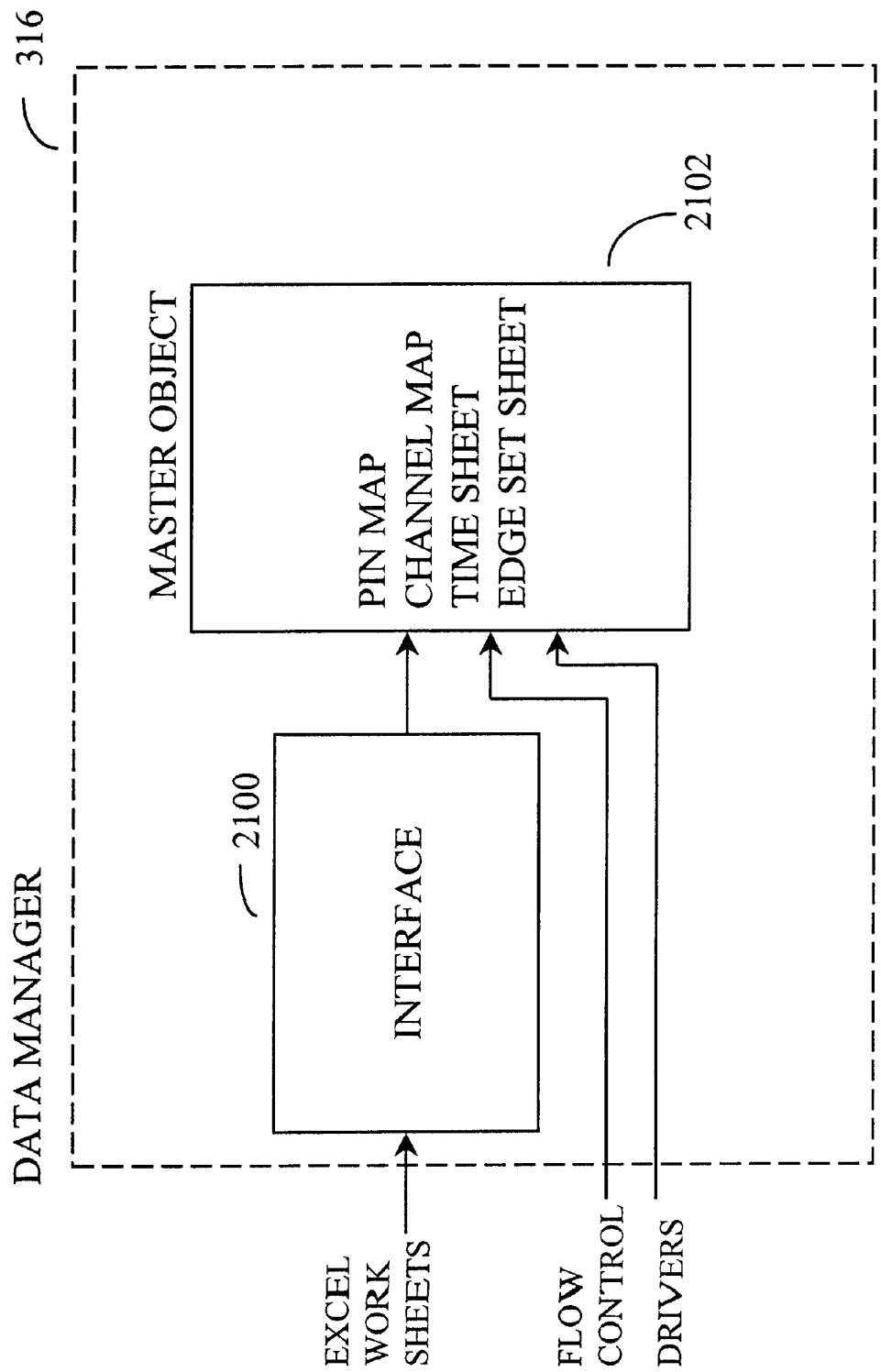
FIG. 5 shows a functional block diagram of the data manager which stores the spreadsheet information of FIGS. 3 and 4.

FIG. 5 shows a functional block diagram of the data manager 316 which stores the Excel spreadsheet information. Excel workbook 312 communicates with Data manager 316 through interface 2100. The data manager is written in C++. Flow control 314, Interface 2100, and instrument drivers 328 all communicate with master object 2102. The master object is the means by which all data stored in the data manager from the Excel spreadsheets is accessed. Flow control 314, drivers 328 and interface 2100 begin with the master object to access all data from each Excel spreadsheet.

Figure 6:
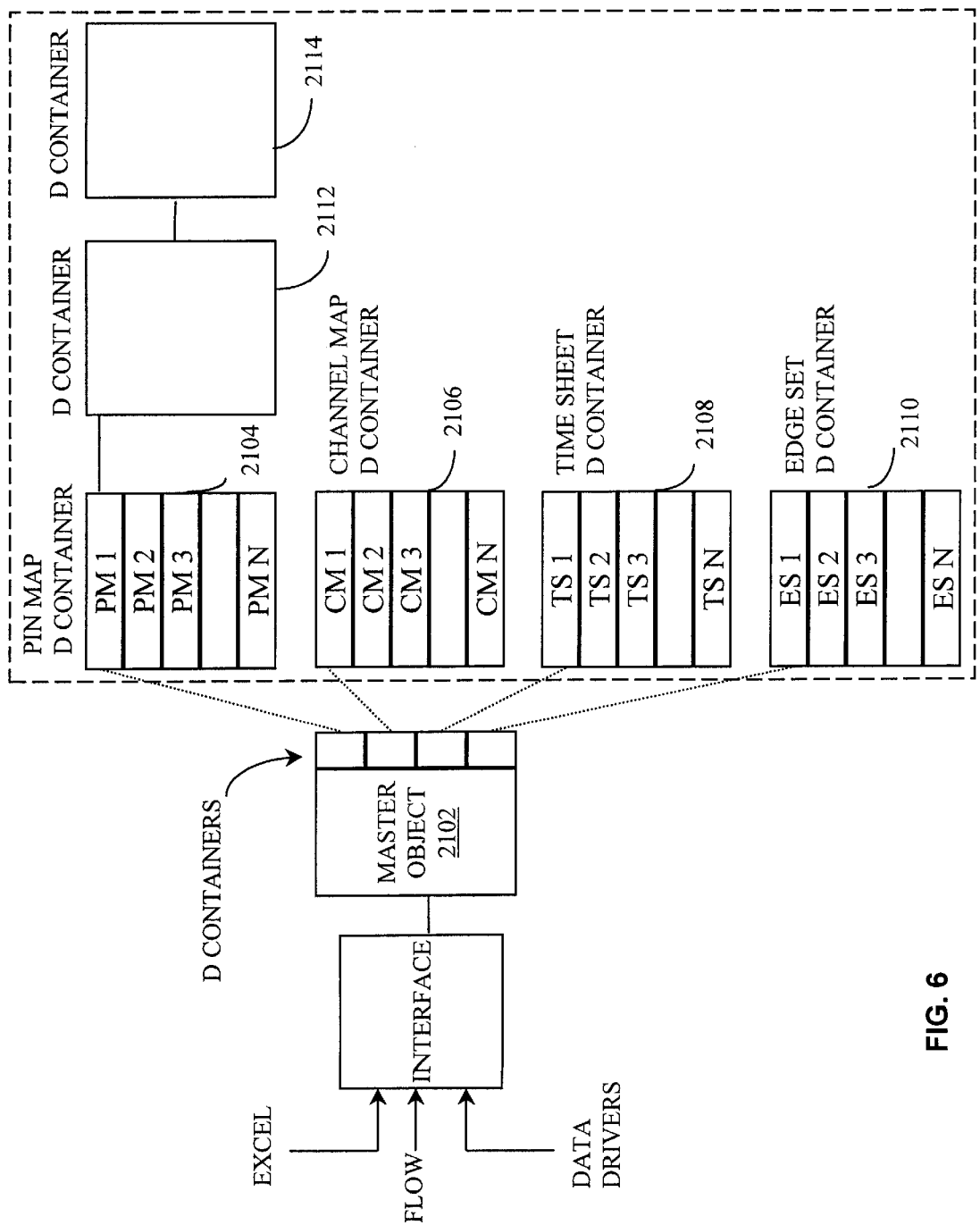
FIG. 6 illustrates the details of the storage and retrieval structure used in the data manager.

FIG. 6 illustrates the details of the storage and retrieval structures used in the data manager 316. The master object 2102 stores a DContainer for each category of spreadsheet data, for example pinmap. A DContainer provides access to data by user-assigned names that appear as names of spreadsheets or as items contained within spreadsheets. FIG. 6 shows a Dcontainer 2104 for pinmap data, and Dcontainers 2106, 2108, 2110 for channelmap data, timesheet data and edgeset data respectively. Additional Dcontainers would be present for each kind of spreadsheet. Dcontainer 2104 for pinmaps contains the names of each pinmap spreadsheet currently loaded in the data manager 316 and the starting addresses at which the data for each of those pinmaps can be found. Likewise the other Dcontainers contain the names and access information of the data corresponding spreadsheets for channels, timesets, edgesets and others.

Other Dcontainers nest from the top level of Dcontainers to hold information for lower level nested layers of information. For example, Dcontainers 2112 and 2114 represent the data for pins and pingroups nested within a pinmap such as is shown in FIG. 4. Since the flow control 314, drivers 328 and interface 2100 access their data only from the master object 2102, each of the top level Dcontainers needs to provide an indication to the master object of search results. These search results appear in the form of a data context that represents the currently accessible data for each type of sheet. The DContainer supplies this context information as described below.

Figure 7:
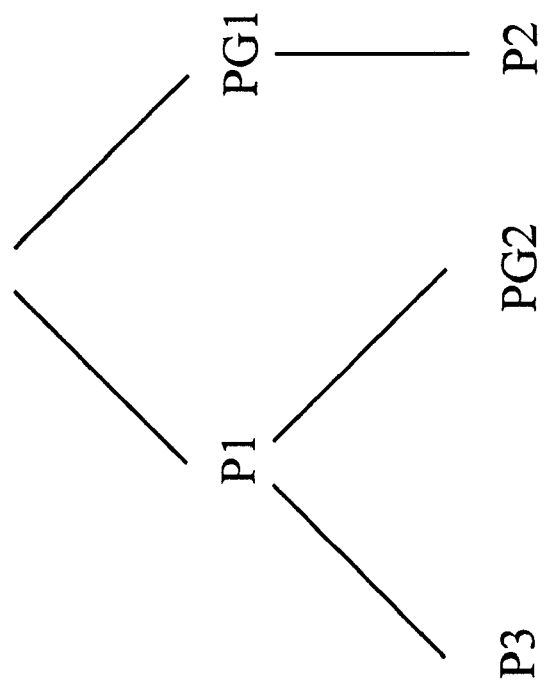
FIG. 7 shows the first layer of pinmap data from FIG. 3 laid out as a binary tree.

Another equally important function of the DContainer is to provide rapid search by name with preservation of order information. (The data in a pinmap sheet consists not only of the names of the pins but also the order in which the pins occur.) To understand how the Dcontainer accomplishes this feat, it is first useful to look at FIG. 4, the graphical illustration of the nested data for a pinmap spreadsheet. There are two prior art methods of laying out the names of pins or pingroups from this nested tree in data manager 316 memory so that they may be searched at a later time . The first is a binary tree from an STL standard C++ class library which allows data to be stored in binary tree data structure. FIG. 7 shows the first layer of pinmap data from FIG. 4 laid out as a binary tree. Each pin or pingroup has a specific location in the tree determined by the layout rules of the binary tree. The binary tree has a search method for rapid access to data by name. The problem is that data related to the order of the names is lost in the binary tree since binary trees store data alphabetically. The name for PG11 for example, can be located in the tree but its order with respect to the other pin or pingroup names is lost.

The other method of laying out pinmap data in the data manager memory is a second STL class, the vector, which preserves order information. Data for each pin or pingroup is stored in a sequentially ordered list in a vector and given an associated index which corresponds to the location in the vector. Vectors are not appropriate for searching by name because the search must be performed sequentially beginning at the start of the vector. For a vector with data for 1024 pins (the maximum number at present), as many as 1024 names need to be searched. This is unacceptably slow. If the data for a pin can be accessed by index, however, it is possible to access the data randomly rather than sequentially. This is done extremely rapidly at a rate that is independent of the number of indexes in the vector.

Neither of these commercially available STL storage and search classes used alone is adequate for searching by name. One loses order information and the other is slow. What the invention does is use both STL classes and combine them in a way to obtain a rapid search by name that maintains all order data. The combination of these classes and the corresponding layout of data in the data manager 316 memory defines the structure and operation of the Dcontainers.

Figure 8:
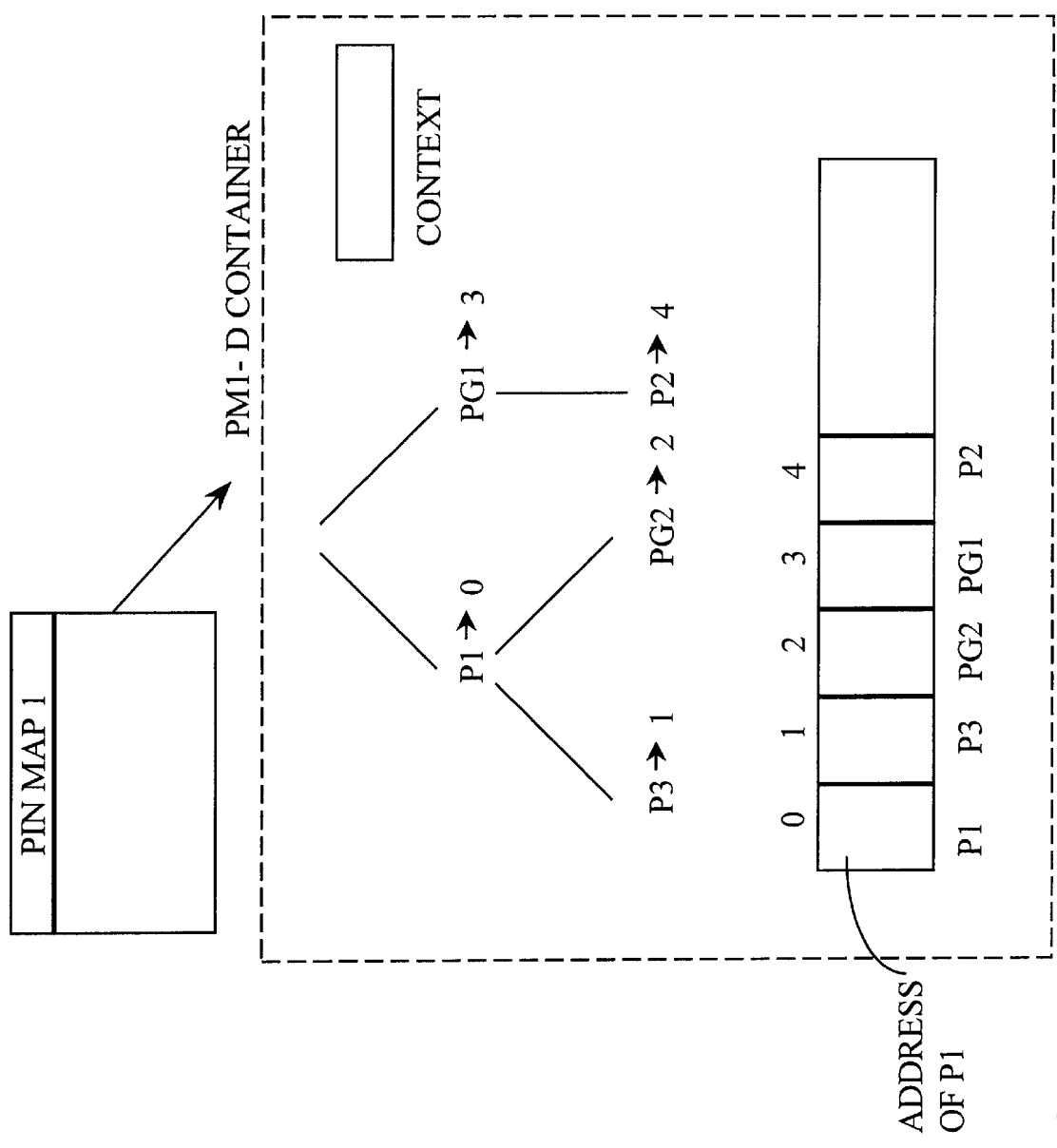
FIG. 8 shows a pinmap Dcontainer for the first level of nested pinmap information shown in FIGS. 3 and 7.

FIG. 8 is an example of a pinmap Dcontainer which allows the data manager to store and search for the first nested level of information of Pinmap1 (PM1) shown in FIGS. 4 and 7. The STL binary tree sets up the pins and pingroups in binary tree shown in FIG. 8. The STL vector class is then used to set up a sequentially ordered vector of each pin and pingroup with a unique index number associated with the position of each pin and pingroup. Each pin and pingroup in an entry in the binary tree contains both the name and the numerical position in the vector. In this way each pin and pin group in the binary tree is mapped into the vector. (Technically, the term map is given to a binary tree that is used to convert names to numbers. This term is also used by the developers of the STL library.)

To search for a pin name in the Dcontainer, the STL binary tree finds the name using a rapid binary search. The found pin name has an associated numerical position number in the numerically ordered list of the associated STL vector class. The number is then used to access the pin data in the STL vector class in a one more step. In other cases, the data in the vector is accessed directly when the order of pins and pingroups is important as opposed to names.

Figure 9:
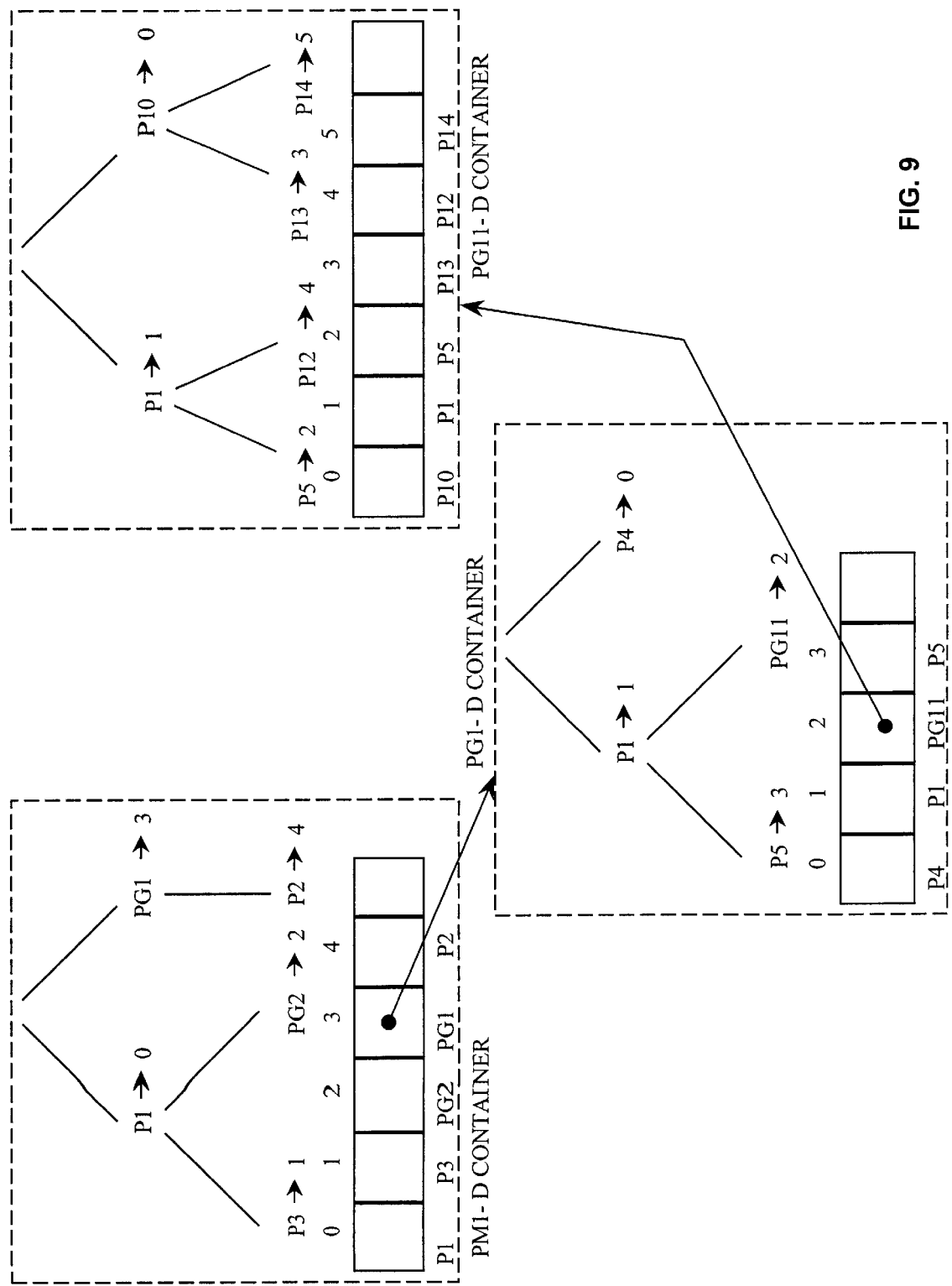
FIG. 9 shows an example of the nesting of Dcontainers for the nested levels of FIG. 4.

The Dcontainer of the FIG. 8 is only searched for data at the top level of the pinmap of FIG. 4. To store data in one of the lower levels, other Dcontainers are linked to the top level Dcontainer in a nested arrangement. FIG. 9 shows an example of the nesting of Dcontainers for the nested levels of FIG. 4. Three levels of Dcontainers PM1, PG1, PG11 are all nested. Similar pin numbers in the vectors for each Dcontainer are all mapped back to the pin number in the top nested level. For example, pin P1 is present in the vectors of each Dcontainer. All of these pins map back to the top nested level Dcontainer. This is physically done in the software by having each P1 in the various nested levels have the address of the P1 in the top nested level. Therefore, if a search is made for P1, when P1 is found in the top nested level it is also found in each of the other levels. No further searching is necessary.

When an item in one of the vectors is located, the Dcontainer stores its vector index. Storing this number is the basis of the context mechanism described previously. This context information is important because it hides the complexity of nested data from other software components. To the components that access data through the data manager, the context information permits these components to assume that there is only one instance of each kind of spreadsheet—one pinmap, one channelmap, and so forth. This greatly simplifies the software implementation of those components. Furthermore, this design significantly enhances the efficiency of these components since they do not require complex searching. A single Dcontainer-assisted search before the start of execution of each test template sets the context.

Figure 11:
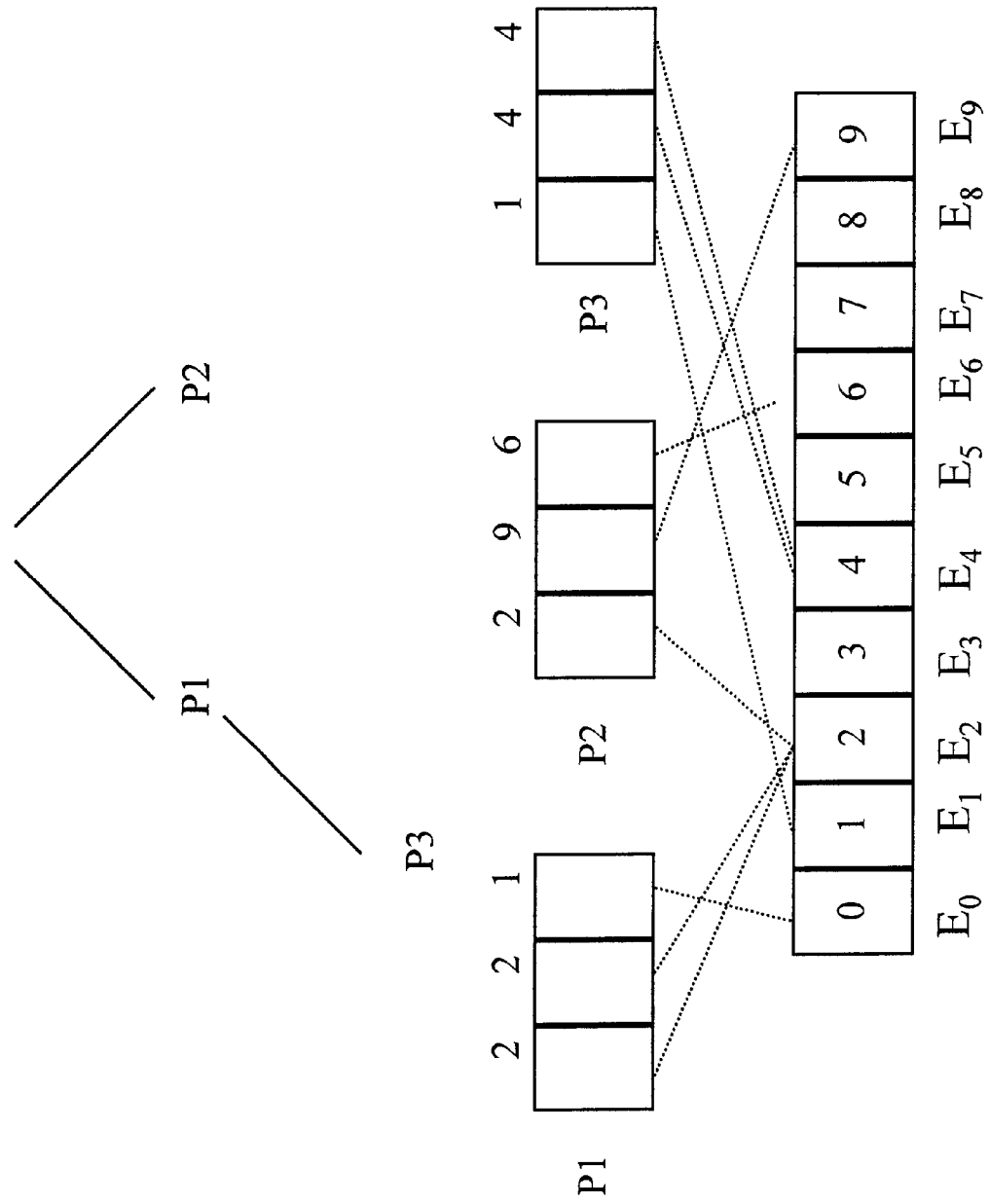
FIG. 11 shows the structure of a Dmulticontainer.

In some cases a name may appear several times in one nested layer. For example, FIG. 10 shows a spreadsheet in which a pin name may be used several times in one nested level of data. In the example, the same pin can be assigned more than one edgeset. To accommodate this case, the Dcontainer is modified to allow a name to be associated with more than one version of the same kind of data; in the example one pin is assigned several edgesets. This type of Dcontainer is called a Dmulticontainer illustrated in FIG. 11. It contains a binary tree with names (P1,P2,P3), and a main vector for containing the numerically ordered list of edgeset data as before. The difference is that the binary tree contains intermediate vectors that map each pin name to a set of vector indices rather than a single vector index as in the Dcontainer. In the example in FIG. 11, P1 maps into the edgesets at numerical positions 2,2,1 in the main vector. Hence, the intermediate vector for P1 contains the position numbers 2,2,1. P2 and P3 similarly have intermediate vectors storing indices of the main vector. The Dmulticontainers may be nested the same way as Dcontainers. The search for an edgeset now requires two pieces of information: a name and a version number that is an index of an intermediate vector. Correspondingly, the context information for the correct P1 is its position in the intermediate vector rather than the main vector.

Looking at FIG. 2 the Excel spreadsheet information managed by the flow control 314 and datamanager 316 is provided through instrument drivers 328 to tester 2002 which may be any state of the art semiconductor tester performing both parallel and/or scan testing. An example of a tester is given in U.S. Pat. No. 5,606,568, assigned to the same assignee Teradyne, which is hereby incorporated by reference.

The foregoing description covers the inventive features of the data manager 316. MICROFICHE APPENDICES A and B describe in more detail the implementation of the invention. An overall functional description of the datamanager 316 is provided in a document entitled "DATA MANAGER" by Alan Blitz. A "DATA MANAGER PROGRAMMER'S GUIDE" by Alan Blitz describes the details of the program.

All rights including copyrights in the material contained in APPENDIX A are vested in and the property of Teradyne the assignee of the present invention. Teradyne retains and reserves all rights in APPENDIX A and grants permission to reproduce the material only in connection with reproduction of the granted patent and for no other purpose.

While the preferred embodiments of the invention have been shown and described, numerous variations and alternative embodiments will occur to those skilled in the art. Accordingly, it is intended that the invention be limited only in terms of the appended claims.

What is claimed is:

1. A data manager for a semiconductor test system comprising,

9 nested levels of named device parameter data, said data manager having one or more Dcontainers each having a mode for storing a nested level of said named data in the form of a tree, and also in an ordered sequence vector, said data in said tree mapped into said ordered sequence vector with mapping indicia defining the position of said named data in said ordered sequence vector, each said Dcontainer having a search mode for searching said tree for said named data and using said mapping indicia associated with said named data to find said named data in said ordered sequence vector, whereby said search finds the named data and its order in said nested level.

2. The semiconductor test system of claim 1 in which said Dcontainer stores an indicator of the position of said named data in said ordered sequence vector.

3. The semiconductor test system of claim 2 in which said tree is a binary tree.

4. The semiconductor test system of claim 2 in which said Dcontainers are nested the same as said nested levels of said named data.

5. The semiconductor test system of claim 2 in which said ordered sequence is a numerically ordered sequence and said mapping indicia is the position of said named data in said numerically ordered sequence.

6. The semiconductor test system of claim 2 in which a commercially available program stores and searches said named data in said tree according to a set of decision logic rules.

7. The semiconductor test system of claim 2 in which a commercially available program stores and searches said named data in said ordered sequence.

8. The semiconductor test system of claim 2 including a spreadsheet workbook having one or more spreadsheets containing said named device parameter data.

9. The semiconductor test system of claim 8 including a flow control cooperating with said spreadsheet workbook and said data-manager to control the flow of spreadsheet information to said data-manager.

10. The semiconductor test system of claim 9 including one or more test templates cooperating with said data-manager, said flow control controlling the flow of said test template information to said data-manager.

11. The semiconductor test system of claim 10 including instrument drivers cooperating with said data-manager, said data-manager providing information from said spreadsheets to said instrument drivers.

12. A data manager for a semiconductor test system comprising, nested levels of named device parameter data, with some names occurring more than once in the same nested level, said data manager having one or more multiDcontainers each having a mode for storing a nested level of said named data in the form of a tree, and also in an ordered sequence vector, each said name of said named data appearing in said tree only once, each said name including all repetitions of one name being in said ordered sequence vector, each said repeated name of said named data being mapped into an intermediate vector which maps each repetition of the same name into said ordered sequence vector with mapping indicia defining the order of said named data in said ordered sequence vector, each said multiDcontainer having a search mode for searching said tree for said named data and using said

10 mapping indicia associated with said named data to find said named data in said intermediate vector and in said ordered sequence vector, whereby said search finds the named data and its order for all repetitions in said nested level.

13. The semiconductor test system of claim 12 in which said Dcontainer stores an indicator of the position of said named data in said ordered sequence vector.

14. The semiconductor test system of claim 13 having both Dcontainers and multicontainers.

15. The semiconductor test system of claim 13 in which said tree is a binary tree.

16. The semiconductor test system of claim 13 in which said Dcontainers are nested the same as said nested levels of said named data.

17. The semiconductor test system of claim 13 in which said ordered sequence is a numerically ordered sequence and said mapping indicia is the position of said named data in said numerically ordered sequence.

18. The semiconductor test system of claim 13 in which a commercially available program stores and searches said named data in said tree according to a set of decision logic rules.

19. The semiconductor test system of claim 13 in which a commercially available program stores and searches said named data in said ordered sequence.

20. A data manager for a semiconductor test system comprising, named device parameter data, said data manager having a Dcontainer with a mode for storing said named data in the form of a tree, and also in an ordered sequence vector, said data in said tree mapped into said ordered sequence vector with mapping indicia defining the position of said named data in said ordered sequence vector, said Dcontainer having a search mode for searching said tree for said named data and using said mapping indicia associated with said named data to find said named data in said ordered sequence vector, said Dcontainer storing an indicator of the position of said named data in said ordered sequence vector, whereby said search finds the named data and its order in said nested level.

21. A data manager for a semiconductor test system comprising, named device parameter data, with some names occurring more than once in the same nested level, said data manager having one or more multiDcontainers with a mode for storing said named data in the form of a tree, and also in an ordered sequence vector, each said name of said named data appearing in said tree only once, each said name including all repetitions of one name being in said ordered sequence vector, each said repeated name of said named data being mapped into an intermediate vector which maps each repetition of the same name into said ordered sequence with mapping indicia defining the order of said named data in said ordered sequence vector, said multiDcontainer having a search mode for searching said tree for said named data and using said mapping indicia associated with said named data to find said named data in said intermediate vector and in said ordered sequence vector, said Dcontainer storing an indicator of the position of said named data in said ordered sequence vector, whereby said search finds the named data and its order for all repetitions.

22. A semiconductor test system comprising, nested levels of named device parameter data, a spreadsheet workbook having one or more spreadsheets containing said named device parameter data, a data manager, a flow control cooperating with said spreadsheet workbook and said data manager to control the flow of spreadsheet information to said data manager, one or more test templates cooperating with said data manager, said flow control controlling the flow of said test template information to said data manager, a data manager having one or more Dcontainers each having a mode for storing a nested level of said named data in the form of a binary tree, and also in an ordered sequence vector, said data in said tree mapped into said ordered sequence vector with numerical indicia defining the position of said named data in said ordered sequence vector, said Dcontainers nested the same as said nested levels of said named data, each said Dcontainer having a search mode for searching said tree for said named data and using said mapping indicia associated with said named data to find said named data in said ordered sequence vector, said Dcontainer storing said numerical indicia, whereby said search finds the named data and its order in said nested level.

* * * * *